US012615830B2

(12) United States Patent
Lee et al.

(10) Patent No.: US 12,615,830 B2
(45) Date of Patent: Apr. 28, 2026

(54) SEMICONDUCTOR STRUCTURE AND METHOD FOR FORMING THE SAME

(71) Applicant: Vanguard International Semiconductor Corporation, Hsinchu (TW)

(72) Inventors: Wen-Shan Lee, Hsinchu City (TW); Chung-Yeh Lee, Xinpu Township (TW); Fu-Hsin Chen, Zhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 612 days.

(21) Appl. No.: 18/057,531

(22) Filed: Nov. 21, 2022

(65) Prior Publication Data

US 2024/0170544 A1    May 23, 2024

(51) Int. Cl.
| | |
|---|---|
| H10D 64/00 | (2025.01) |
| H10D 30/01 | (2025.01) |
| H10D 30/66 | (2025.01) |
| H10D 62/17 | (2025.01) |

(52) U.S. Cl.
CPC ....... H10D 64/117 (2025.01); H10D 30/0291 (2025.01); H10D 30/66 (2025.01); H10D 62/393 (2025.01)

(58) Field of Classification Search
CPC ............... H10D 64/112; H10D 64/117; H10D 30/0291; H10D 30/66; H10D 62/393
See application file for complete search history.

(56) References Cited

U.S. PATENT DOCUMENTS

| | | | | |
|---|---|---|---|---|
| 6,545,316 | B1 * | 4/2003 | Baliga .................... | H10D 84/83 |
| | | | | 257/329 |
| 8,664,716 | B2 * | 3/2014 | Hashimoto ............ | H10D 30/66 |
| | | | | 257/E21.616 |
| 8,748,976 | B1 * | 6/2014 | Kocon ............... | H10D 30/0297 |
| | | | | 257/330 |
| 8,803,236 | B1 * | 8/2014 | Lee ....................... | H10D 64/256 |
| | | | | 438/533 |
| 12,464,747 | B2 * | 11/2025 | Yilmaz ................ | H10D 30/668 |
| 2003/0089947 | A1 * | 5/2003 | Kawaguchi ........... | H10P 30/204 |
| | | | | 257/E29.054 |

(Continued)

FOREIGN PATENT DOCUMENTS

TW          200941731 A1    10/2009

*Primary Examiner* — Joseph C. Nicely

(74) *Attorney, Agent, or Firm* — Birch, Stewart, Kolasch & Birch, LLP

(57) ABSTRACT

A semiconductor structure is provided. The semiconductor structure includes a substrate, an epitaxy layer, a well region, a gate electrode, a conductive structure, and a source electrode. The substrate has a first conductive type. The epitaxy layer has the first conductive type and is disposed on the substrate. The well region has a second conductive type. The second conductive type is different than the first conductive type. The well region is disposed in the epitaxy layer. The gate electrode is disposed on the well region. The conductive structure includes an upper portion and a lower portion. The lower portion extends in the direction of the substrate into the epitaxy layer and the upper portion is disposed on the epitaxy layer. The source electrode is disposed on the conductive structure.

18 Claims, 12 Drawing Sheets

(56)                  References Cited

U.S. PATENT DOCUMENTS

| | | | |
|---|---|---|---|
| 2003/0227052 A1* | 12/2003 | Ono | H10D 30/0291 |
| | | | 257/E29.066 |
| 2010/0327348 A1* | 12/2010 | Hashimoto | H10D 30/66 |
| | | | 257/E21.616 |
| 2013/0214354 A1* | 8/2013 | Chan | H10D 62/111 |
| | | | 257/E21.409 |
| 2015/0349110 A1* | 12/2015 | Kocon | H10D 30/665 |
| | | | 257/334 |
| 2016/0163804 A1* | 6/2016 | Kocon | H10D 64/112 |
| | | | 257/329 |
| 2016/0260831 A1 | 9/2016 | Prasad et al. | |
| 2017/0207335 A1* | 7/2017 | Lin | H10D 30/65 |
| 2018/0366569 A1* | 12/2018 | Zeng | H10D 30/473 |
| 2019/0386129 A1* | 12/2019 | Lee | H10D 30/66 |
| 2021/0083061 A1* | 3/2021 | Darwish | H10D 62/157 |
| 2026/0047372 A1* | 2/2026 | Abiko | H10P 50/692 |

* cited by examiner

SEMICONDUCTOR STRUCTURE AND METHOD FOR FORMING THE SAME

BACKGROUND

Field of the Disclosure

The present disclosure relates to a semiconductor structure, and more particularly, to a planar power metal-oxide-semiconductor field effect transistor (MOSFET) with separate shield gates and vertical field plates.

Description of the Related Art

High-voltage device technology is generally used in high-voltage and high-power circuits or drive circuits. In order to meet the performance requirements for traditional power transistors, which include a high withstand voltage, a high current, and a high power density, the structure of the power device has developed from a plane direction to a vertical direction. Currently, vertical diffused metal oxide semiconductor field effect transistors (Diffused MOSFETs) have been developed.

However, drain-to-source on-resistance (Rdson) (hereinafter referred to as on-resistance) is relatively high in a conventional vertical diffused metal oxide semiconductor field effect transistor (DMOS). It is difficult to achieve a tradeoff between drain-to-source breakdown voltage (BVDSS) (hereinafter referred to as breakdown voltage), gate-to-drain capacitance (Cgd) and on-resistance (Rdson) by adjusting the width of the JFET opening or adjusting the JEFT concentration.

Therefore, it is necessary to seek novel metal oxide semiconductor field effect transistors and methods for forming the same to solve or improve the above-mentioned problems.

BRIEF SUMMARY

A semiconductor structure is provided. The semiconductor structure includes a substrate, an epitaxy layer, a well region, a gate electrode, a conductive structure, and a source electrode. The substrate has a first conductive type. The epitaxy layer has the first conductive type and is disposed on the substrate. The well region has a second conductive type. The second conductive type is different than the first conductive type. The well region is disposed in the epitaxy layer. The gate electrode is disposed on the well region. The conductive structure includes an upper portion and a lower portion. The lower portion extends in the direction of the substrate into the epitaxy layer and the upper portion is disposed on the epitaxy layer. The source electrode is disposed on the conductive structure.

Another semiconductor structure is provided. The semiconductor structure includes a substrate, an epitaxy layer, a conductive structure, a pair of well regions, a pair of gate electrodes, and a source electrode. The substrate has a first conductive type. The epitaxy layer has the first conductive type and is disposed on the substrate. The conductive structure includes an upper portion and a lower portion. The lower portion extends in the direction of the substrate into the epitaxy layer and the upper portion is disposed on the epitaxy layer. The pair of well regions has a second conductive type. The second conductive type is different than the first conductive type. The pair of well regions is disposed on opposite sides of the lower portion of the conductive structure. The pair of gate electrodes is disposed on opposite sides of the upper portion of the conductive structure. The source electrode is disposed on the conductive structure.

A method for forming a semiconductor structure is provided. The method includes: providing a substrate; forming an epitaxy layer on the substrate; forming a well region in the epitaxy layer; forming a gate electrode on the well region; forming an upper portion and a lower portion of a conductive structure on the epitaxy layer and in the epitaxy layer; and forming a source electrode on the conductive structure. The substrate has a first conductive type. The epitaxy layer has the first conductive type. The well region has a second conductive type. The second conductive type is different than the first conductive type.

A detailed description is given in the following embodiments with reference to the accompanying drawings.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1:
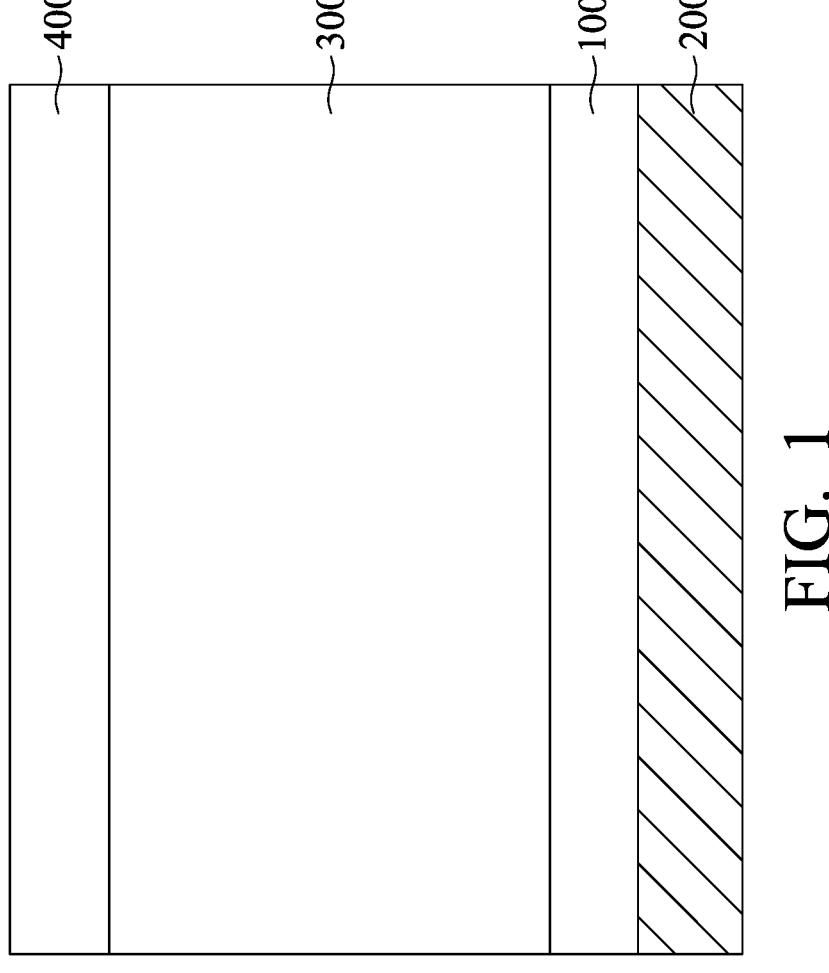
FIGS. 1-12 are cross-sectional views illustrating forming a semiconductor structure at different stages according to some embodiments of the present invention.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present invention may repeat reference numerals and/or letters in the various examples. This repetition is for the purpose of simplicity and clarity and does not in itself dictate a relationship between the various embodiments and/or configurations discussed.

Some variations of the embodiments are described below. In the different drawings and described embodiments, similar reference numerals are used to designate similar elements. It will be appreciated that additional operations may be provided before, during, and after the method, and that some of the described operations may be replaced or deleted for other embodiments of the foregoing method.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

In the embodiment of the present invention, the conductive structure, which may be used as a vertical field plate (vertical field plate) and as a reduced surface field (RESURF), is disposed in the epitaxy layer and penetrates through the current splitting layer of the parasitic junction gate field-effect transistor (JFET) so as to effectively suppress the on-resistance (Rdson) while maintaining the breakdown voltage. In addition, in the embodiment of the present invention, the conductive structure, which is disposed above the gate electrode and covers the edge of the gate electrode, may be used as a horizontal field plate to reduce the oxide electrical field at the edge of the gate electrode, thereby improving reliability of the device. In addition, in the embodiment of the present invention, a pair of gate electrodes is formed by separating the conductive structure to reduce the area covered by the gate electrodes on the parasitic junction field effect transistor (JFET), thereby effectively reducing the gate-to-drain capacitance (Cgd).

Some variations of the embodiments are described below. In the different drawings and the illustrated embodiments, like reference numerals are used to designate like elements.

FIGS. 1-12 are cross-sectional views illustrating forming a semiconductor structure at different stages according to some embodiments of the present invention. Additional operations may be provided before, during, and/or after the stages described in FIGS. 1-12. In various embodiments, some of the aforementioned operations may be moved, deleted, or replaced. Additional components may be added to the semiconductor structure. In various embodiments, some of the components described below may be moved, deleted or replaced.

Referring to FIG. 1, a substrate 100 having a first conductive type is provided. In some embodiments, the substrate 100 may be made of silicon or other semiconductor materials, such as silicon wafers, bulk semiconductors, or wide-gap semiconductors. In some embodiments, the substrate 100 may be an elemental semiconductor, such as a silicon substrate; the substrate 100 may also be a compound semiconductor, such as a silicon carbide substrate, or a gallium nitride substrate. In some embodiments, the substrate 100 may be a doped or undoped semiconductor substrate.

In the embodiment of the present invention, the first conductive type is an n-type, but is not limited thereto. In some other embodiments, the first conductive type may also be p-type.

In some embodiments, the device process is performed on one side (such as the front side) of the substrate 100, and deposition processes, sputtering, resistive heating evaporation, electron beam evaporation, or any other suitable metal coating process is also performed to form source and gate metal electrodes. Then, a drain electrode 200 is provided on the other side of the substrate 100 by a similar method.

Continuing to refer to FIG. 1, an epitaxy layer 300 having a first conductive type is formed on the side of the substrate 100 where the drain electrode 200 is not disposed. That is, the substrate 100 and the epitaxy layer 300 have the same conductive type. In the embodiment of the present invention, the epitaxy layer 300 is n-type. In some embodiments, the doping concentration of the epitaxy layer 300 is less than the doping concentration of the substrate 100. In some embodiments, the formation of the epitaxy layer 300 may include an epitaxy growth process, such as metal organic chemical vapor deposition (MOCVD), plasma-enhanced chemical vapor deposition (plasma-enhanced CVD, PECVD), molecular beam epitaxy (MBE), hydride vapor phase epitaxy (HYPE), liquid phase epitaxy (LPE), chloride vapor phase epitaxy (Cl-VPE), other suitable process methods, or a combination of the foregoing.

Continuing to refer to FIG. 1, a current splitting layer (CSL) 400 having a first conductive type is formed on the epitaxy layer 300. That is, the epitaxy layer 300 and the current splitting layer 400 have the same conductive type. In the embodiment of the present invention, the current splitting layer 400 is n-type. In some embodiments, the doping concentration of the current splitting layer 400 is greater than that of the epitaxy layer 300 to reduce the on-resistance (Rdson). In some embodiments, the thickness of the current splitting layer 400 is less than the thickness of the epitaxy layer 300 to achieve a desired breakdown voltage (BVDSS). In some embodiments, the formation of the current splitting layer 400 may include an epitaxy growth process, an implantation process, and the like as described above. In some embodiments, after the epitaxy layer 300 is formed by an epitaxy growth process, the current splitting layer 400 may be formed by adjusting the doping concentration by an implantation process.

Figure 2:
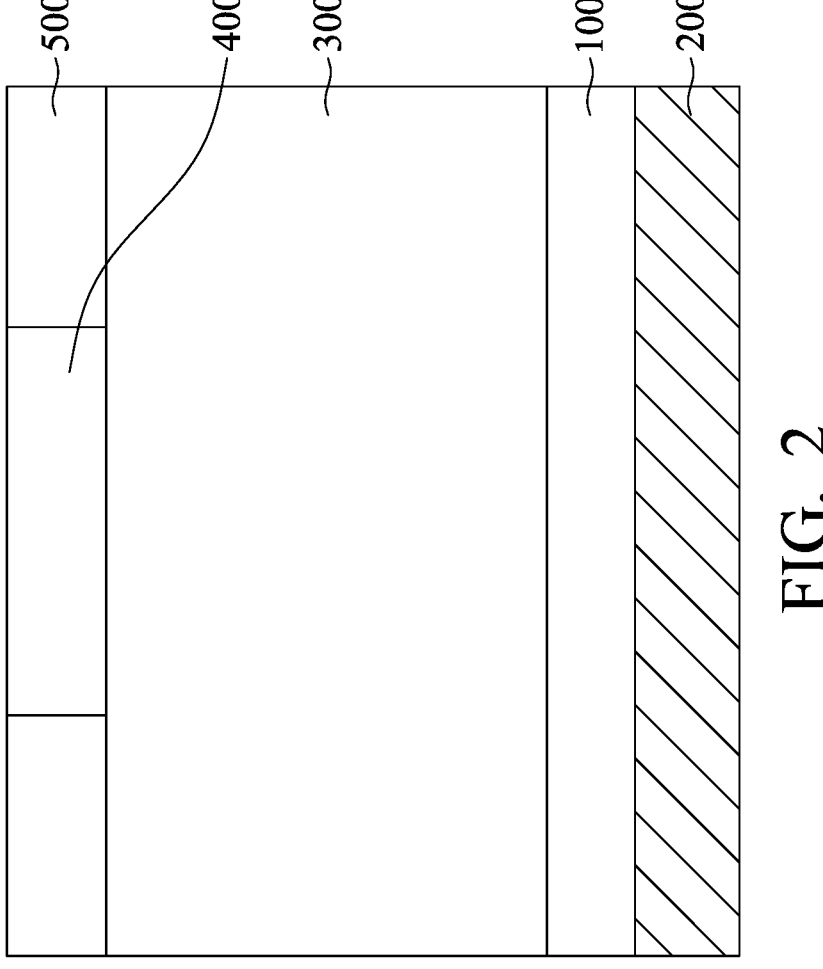

Next, referring to FIG. 2, a well region 500 having a second conductive type is formed in the current splitting layer 400 to facilitate the subsequent formation of a channel region above the well region 500. That is, the well region 500 and the current splitting layer 400 have different conductive types. In the embodiment of the present invention, the current splitting layer 400 is p-type. In some embodiments, the bottom surface of the well region 500 is lower than or equal to the bottom surface of the current splitting layer 400 to prevent punch through of the subsequently formed heavily doped region.

In some embodiments, a patterned photoresist is used as a protective mask to perform an implantation process on the current splitting layer 400 at a predetermined position, so that the predetermined position is converted from the first conductive type to the second conductive type. After the well region 500 is formed, the current splitting layer 400 is denoted as 400'. As can be seen from FIG. 2, a pair of well regions 500 are formed on both sides of the current splitting layer 400'.

Figure 3:
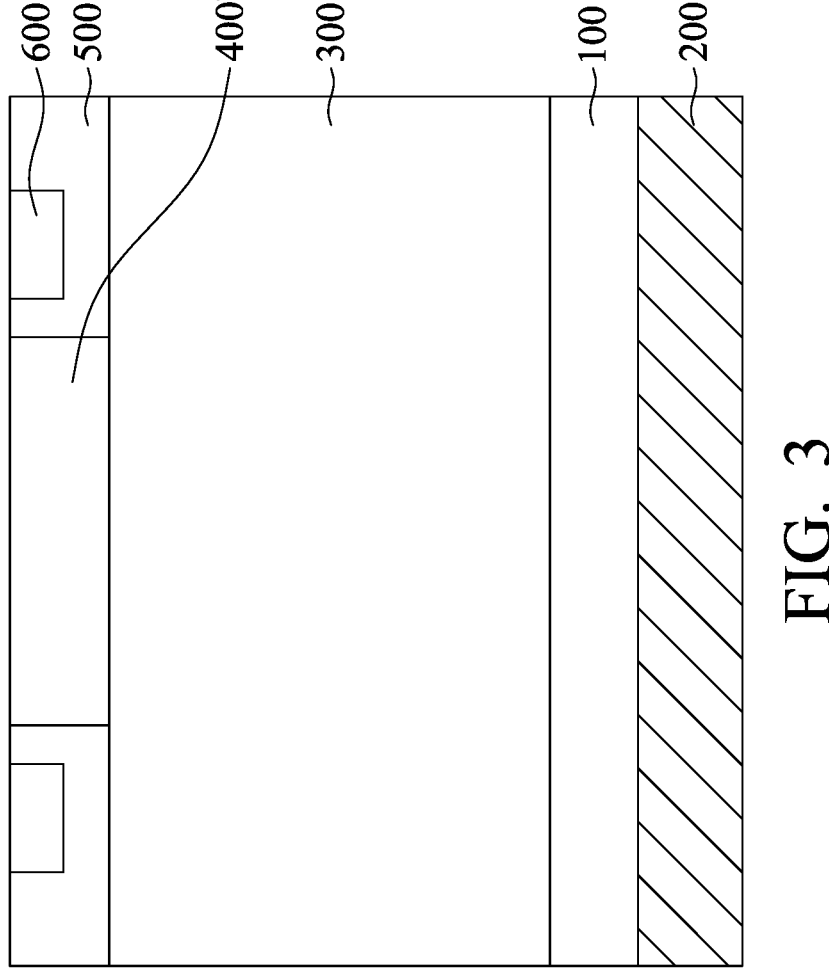

Next, referring to FIG. 3, a first heavily doped region 600 having the first conductive type is formed in the well region 500 having the second conductive type. That is, the first heavily doped region 600 and the well region 500 have different conductive types. In the embodiment of the present invention, the first heavily doped region 600 is n-type. In some embodiments, the well region 500 covers the bottom surface of the first heavily doped region 600, that is, the bottom surface of the well region 500 is lower than the bottom surface of the first heavily doped region 600 to maintain a depleted area at the PN junction, which is helpful for the device to withstand voltage.

In some embodiments, a patterned photoresist is used as a protective mask to perform an implantation process on a predetermined position of the well region 500, so that the predetermined position is converted from the second conductive type to the first conductive type. It can be seen from FIG. 3 that a pair of first heavily doped regions 600 are respectively formed on both sides of the current splitting layer 400', and are respectively formed in the pair of well regions 500.

Figure 4:
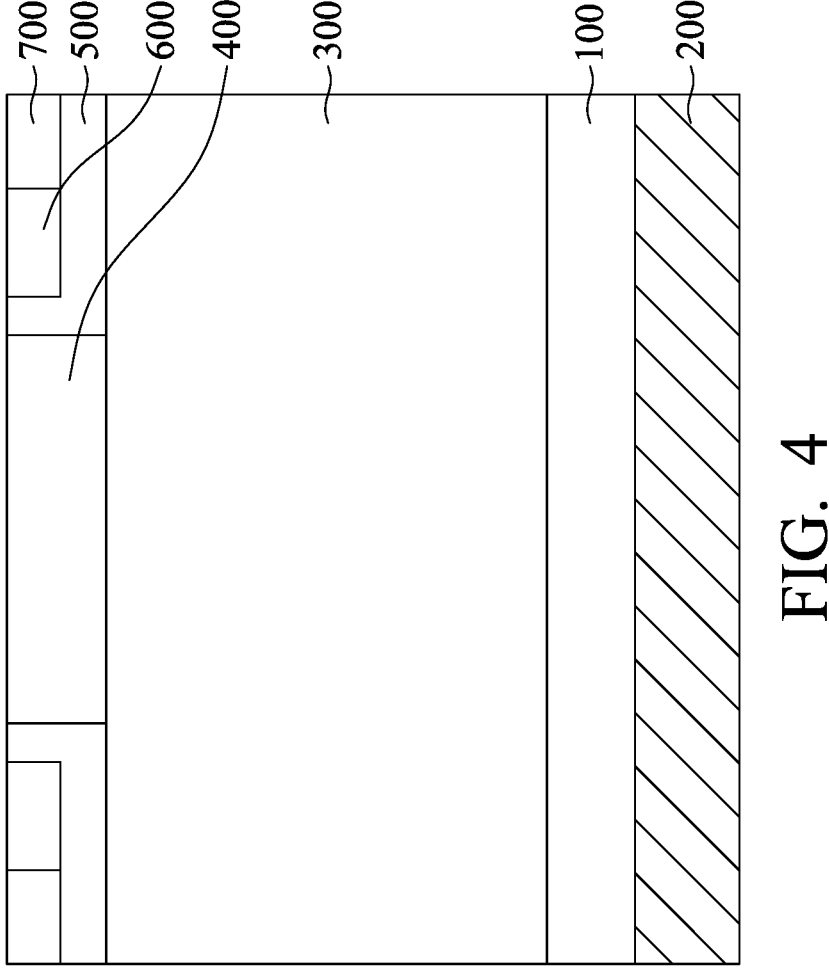

Next, referring to FIG. 4, a second heavily doped region 700 having the second conductive type is formed in the well region 500 having the second conductive type, and the second heavily doped region 700 is adjacent to the first heavily doped region 600. Thus, the well region 500 is connected to the source through a well ohmic contact, and the start-up voltage is stabilized to reduce the influence of the body effect. That is, the second heavily doped region 700 and the first heavily doped region 600 have different conductive types. In the embodiment of the present invention, the second heavily doped region 700 is p-type. In some embodiments, the well region 500 covers the bottom surface of the second heavily doped region 700, that is, the bottom surface of the well region 500 is lower than the bottom surface of the second heavily doped region 700.

In some embodiments, a patterned photoresist is used as a protective mask to perform an implantation process on a predetermined position of the well region 500 to change the doping concentration of the predetermined position. As can be seen from FIG. 4, a pair of second heavily doped regions 700 is respectively formed adjacent to a pair of first heavily doped regions 600, and is respectively formed in the pair of well regions 500.

In some embodiments, the doping concentrations of the epitaxy layer 300, the current spitting layer 400', the well region 500, the first heavily doped region 600 and the second heavily doped region 700 are about $10^{15}$-$10^{16}$ atoms/cm$^3$, about $10^{16\text{-}17}$ atoms/cm$^3$, about $10^{17\text{-}18}$ atoms/cm$^3$, about $10^{19\text{-}20}$ atoms/cm$^3$, and about $10^{19\text{-}20}$ atoms/cm$^3$, respectively. That is, the well region 500, the current splitting layer 400' far from the substrate 100 has a greater doping concentration than the epitaxy layer 300 closer to the substrate 100 to reduce on-resistance (Rdson) while maintaining desired breakdown voltage (BVDSS).

Figure 5:
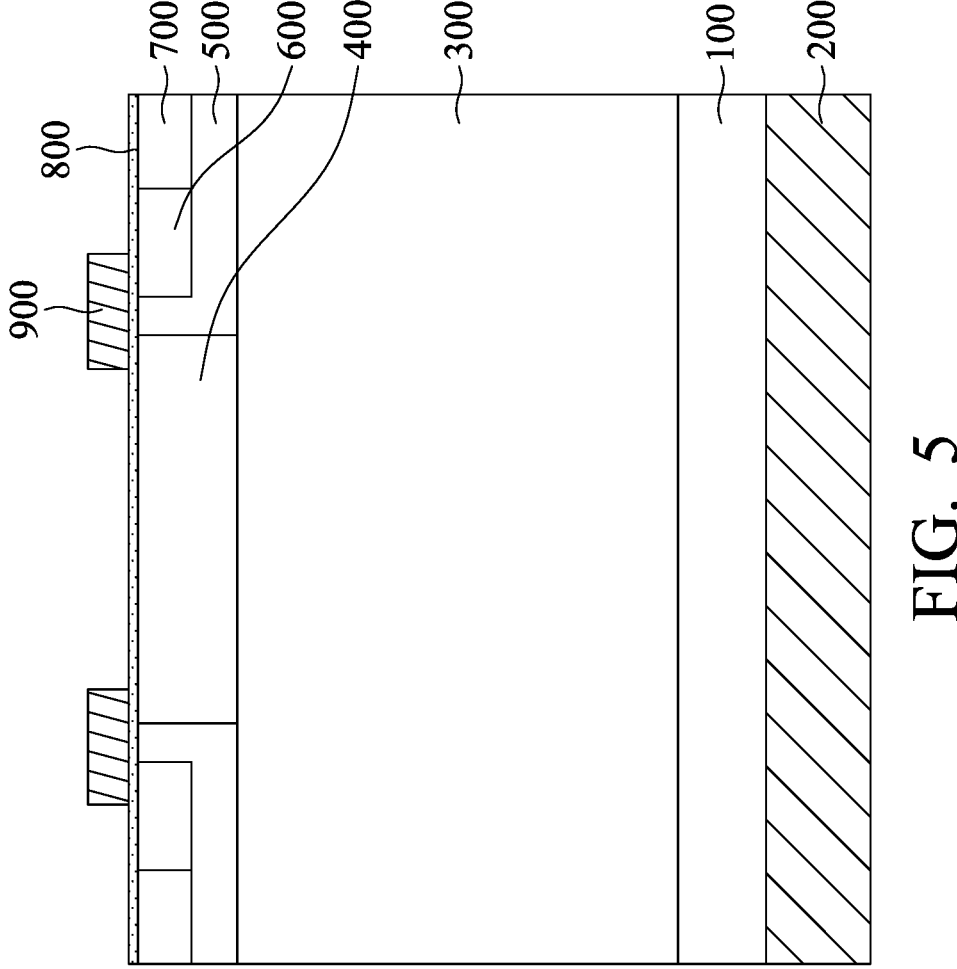

Next, referring to FIG. 5, a gate dielectric layer 800 is formed on the well region 500 and the current splitting layer 400'. In some embodiments, the gate dielectric layer 800 covers the top surfaces of the current splitting layer 400', the well region 500, the first heavily doped region 600 and the second heavily doped region 700. In some embodiments, gate dielectric layer 800 includes a dielectric material, such as oxide. The aforementioned oxides may include silicon oxide, zirconium oxide, aluminum oxide, other suitable high-k dielectric materials, or a combination of the foregoing.

In some embodiments, the formation of the gate dielectric layer 800 may include a deposition process, such as a physical vapor deposition (PVD) process, a chemical vapor deposition (CVD) process, atomic layer deposition (ALD) process, other suitable process, or a combination of the foregoing. The aforementioned CVD process may be, for example, low pressure chemical vapor deposition (LPCVD), low temperature chemical vapor deposition (LTCVD), rapid thermal chemical vapor deposition (RTCVD), PECVD, atmospheric pressure chemical vapor deposition (APCVD).

Continuing to refer to FIG. 5, a patterned gate electrode 900 is formed on the gate dielectric layer 800. In some embodiments, the patterned gate electrode 900 spans over the well region 500 which is located between the first heavily doped region 600 and the current splitting layer 400' and corresponds to the channel region. In some embodiments, two side surfaces of the patterned gate electrode 900 extend to the first heavily doped region 600 and the current splitting layer 400', respectively, to prevent offset. As can be seen from FIG. 5, a pair of patterned gate electrodes 900 respectively correspond to a pair of well regions 500 and are located on both sides of the current splitting layer 400'. Also, a pair of patterned gate electrodes 900 are spaced apart from each other.

In some embodiments, the patterned gate electrode 900 may include a conductive material similar to that described above. In the embodiment of the present invention, the patterned gate electrode 900 includes polysilicon doped with the first conductive type. In some embodiments, the formation of the patterned gate electrode 900 includes a deposition process, a lithography process, an etching process (the lithography process and the etching process are collectively referred to as a patterning process) and the like. In the embodiment of the present invention, the conductive material is first blanket deposited, and then the conductive material is patterned through a patterning process to form the patterned gate electrode 900. The aforementioned lithography process may include photoresist coating (such as spin coating), soft bake, mask alignment, exposure, post-exposure bake, photoresist development, cleaning and drying (such as hard bake), other suitable process or a combination of the foregoing. The aforementioned etching process may include a dry etching process, a wet etching process, or other suitable etching processes. Dry etching may include plasma etching, plasmaless gas etching, sputter etching, ion milling, reactive ion etching (RIE), neutral beam etching (NBE), inductive coupled plasma etch. Wet etching may include using an acidic solution, an alkaline solution, or a solvent to remove at least a portion of the structure to be removed. In addition, the etching process may also be pure chemical etching, pure physical etching, or any combination thereof.

Compared with the gate electrode that spans over the entire current splitting layer in the prior art, the embodiment of the present invention may reduce the amount of the gate electrode covering the current splitting layer by patterning (dividing) the gate electrode into a pair of gate electrodes, and further reduce the gate-to-drain capacitance (Cgd).

Figure 6:
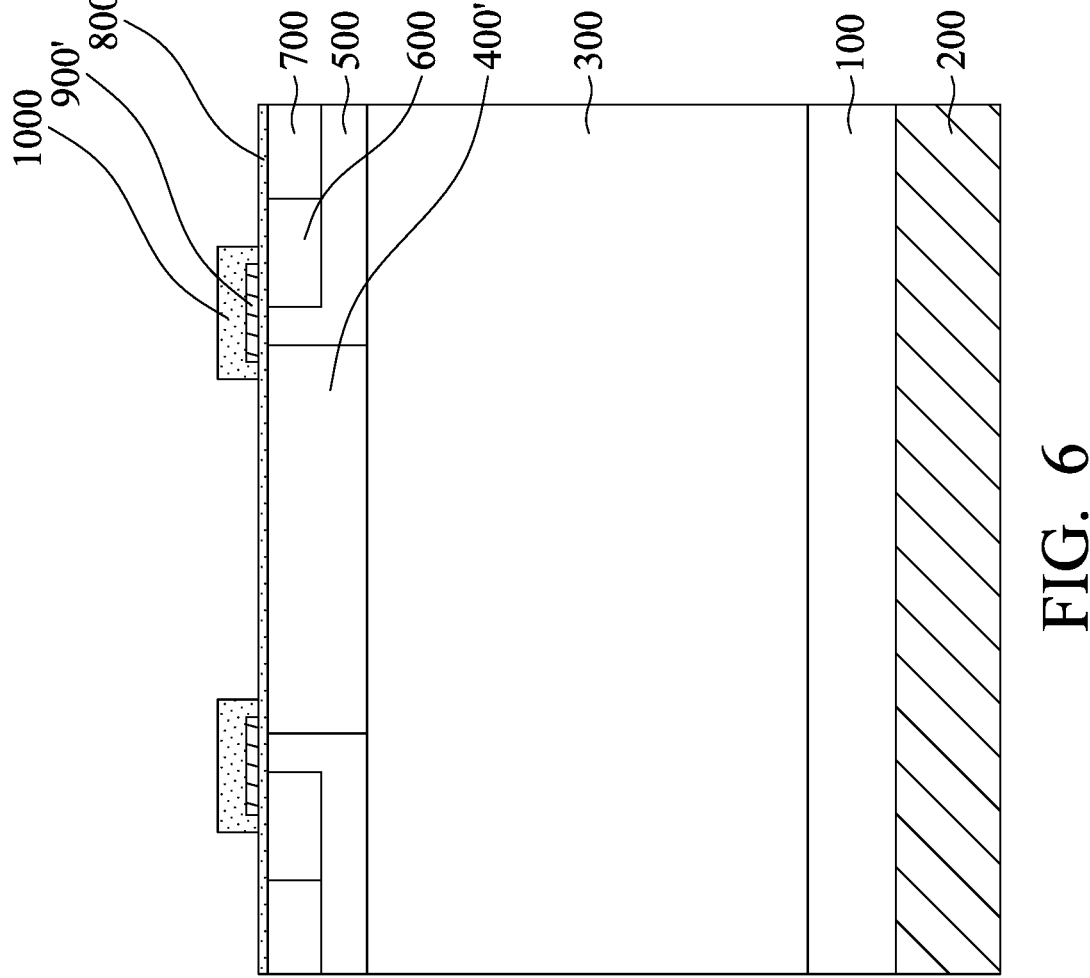

Next, referring to FIG. 6, the patterned gate electrode 900 is oxidized to form a gate electrode 900' and a dielectric layer 1000 covering the gate electrode 900'. Since a portion of the patterned gate electrode 900 is oxidized to the dielectric layer 1000, the gate electrode 900' is narrower and lower than the patterned gate electrode 900. In some embodiments, the dielectric layer 1000 is used to isolate the gate electrode 900' from subsequent conductive structures. The dielectric layer 1000 may include silicon oxide, germanium oxide, other suitable semiconductor oxide materials, or a combination of the foregoing. The formation of the dielectric layer 1000 includes an oxidation process, such as thermal oxidation, radical oxidation or other suitable processes.

It should be noted that the gate electrode 900' is still located on a portion of the first heavily doped region 600, the well region 500, and the current splitting layer 400'. That is, the gate electrode 900' still spans over the well region 500 located between the first heavily doped region 600 and the current splitting layer 400'. In other words, the gate electrode 900' spans over the first heavily doped region 600 but does not span the second heavily doped region 700.

Figure 7:
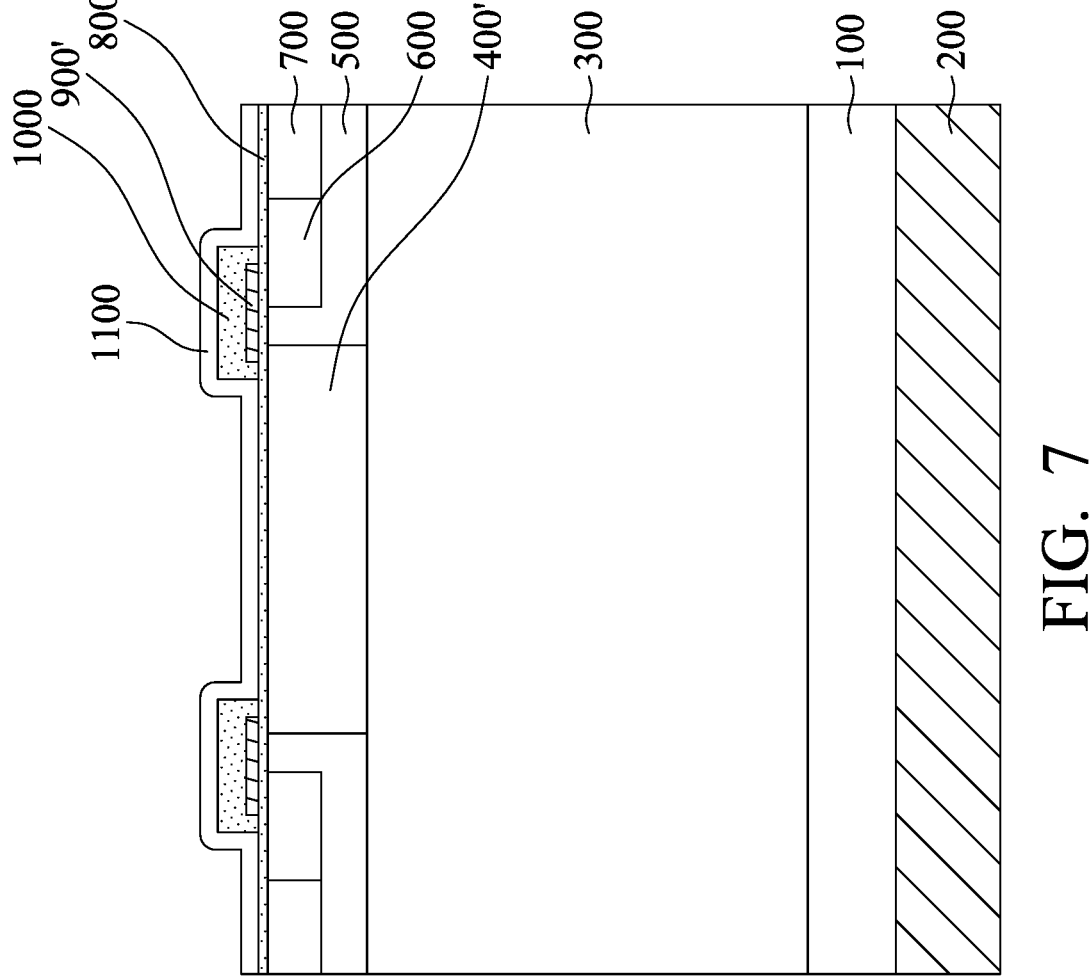

Next, referring to FIG. 7, a protective layer 1100 is formed on the gate electrode 900'. In detail, the protective layer 1100 is deposited on the gate electrode 900' using a conformal deposition process. The protective layer 1100 may include a dielectric material, such as an oxide. The aforementioned oxide may include silicon dioxide. The deposition process may include a deposition process similar to the above-mentioned deposition process, and thus will not be repeated here.

Figure 8:
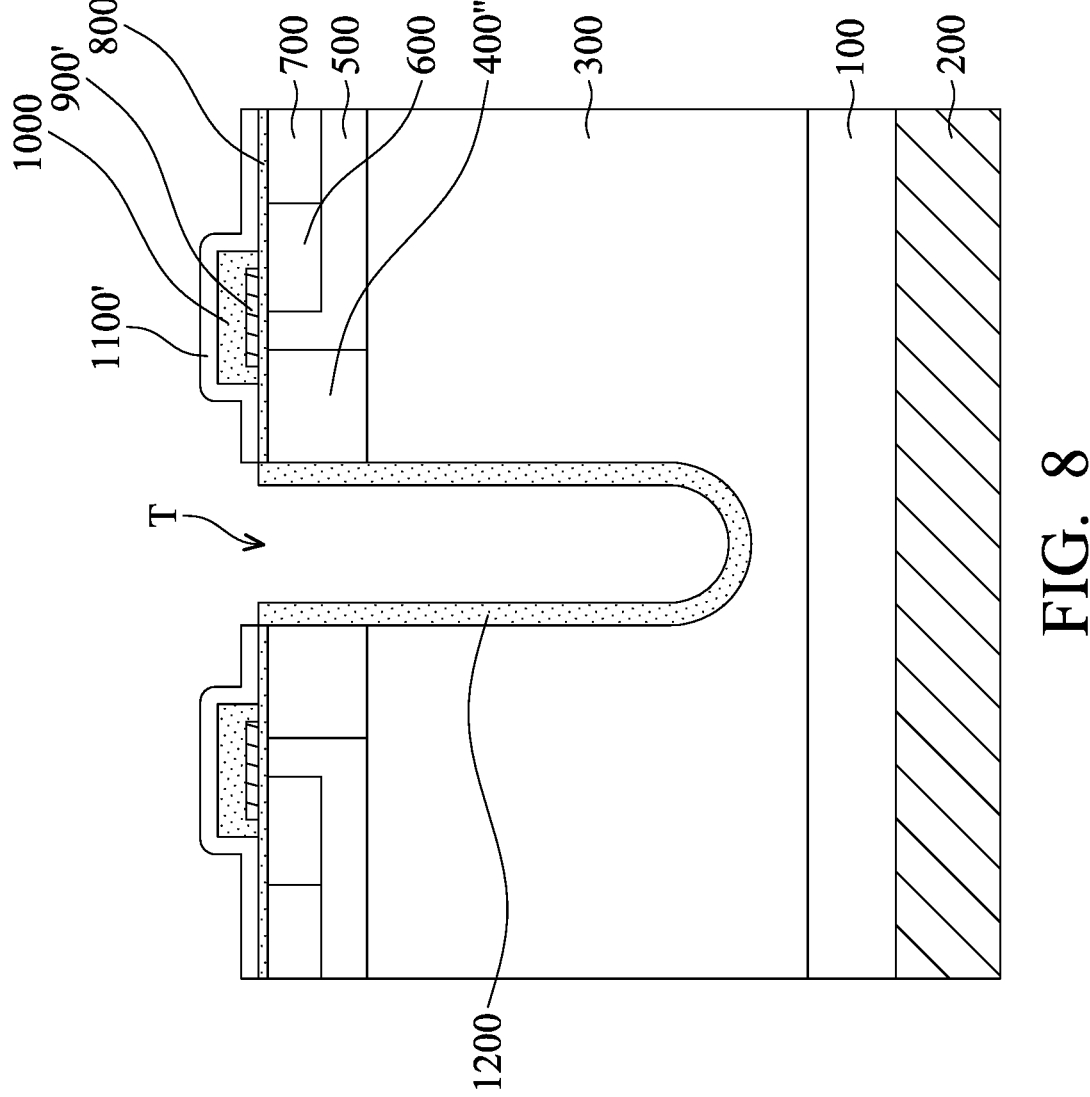

Next, referring to FIG. 8, the protective layer 1100 is patterned. Specifically, by using the patterned photoresist as a protective mask, an etching process is performed on the protective layer 1100 at a predetermined position to form a patterned protective layer 1100'.

Continuing to refer to FIG. 8, using the patterned protective layer 1100' as an etching mask, the epitaxy layer 300 is etched to form the trench T. In some embodiments, the trench T penetrates the current splitting layer 400', so that the current splitting layer 400'' is located on both sides of the trench T and surrounds the trench T. It should be noted that the bottom surface of the trench T is not in contact with the substrate 100 to prevent the bottom of the trench from penetrating into the high-voltage region and causing the electric field to be too large. In some embodiments, a pair of well regions 500, a pair of first heavily doped regions 600, a pair of second heavily doped regions 700, and a pair of gate electrodes 900' are all symmetrical with respect to the trench T. The formation of the trench T includes using an etching process similar to the above, and details are not repeated here.

Continuing to refer to FIG. 8, the trench T is oxidized to form a shielding dielectric layer 1200 on the sidewall and the bottom of the trench T to isolate the epitaxy layer 300 from the subsequently formed conductive structures. It should be noted that the shielding dielectric layer 1200 is formed by oxidizing the sidewalls and bottom of the trenches T, so it has a substantially uniform thickness. Thus, an auxiliary depletion region may be formed in the drift region between the trenches T later, so that the effect of reducing the surface electric field is better.

In some embodiments, the shielding dielectric layer 1200 may include a material similar to that of the dielectric layer 1000, and thus will not be repeated here. In some embodiments, the formation of the shielding dielectric layer 1200 includes the use of an oxidation process similar to that described above, and thus is not repeated here.

Figure 9:
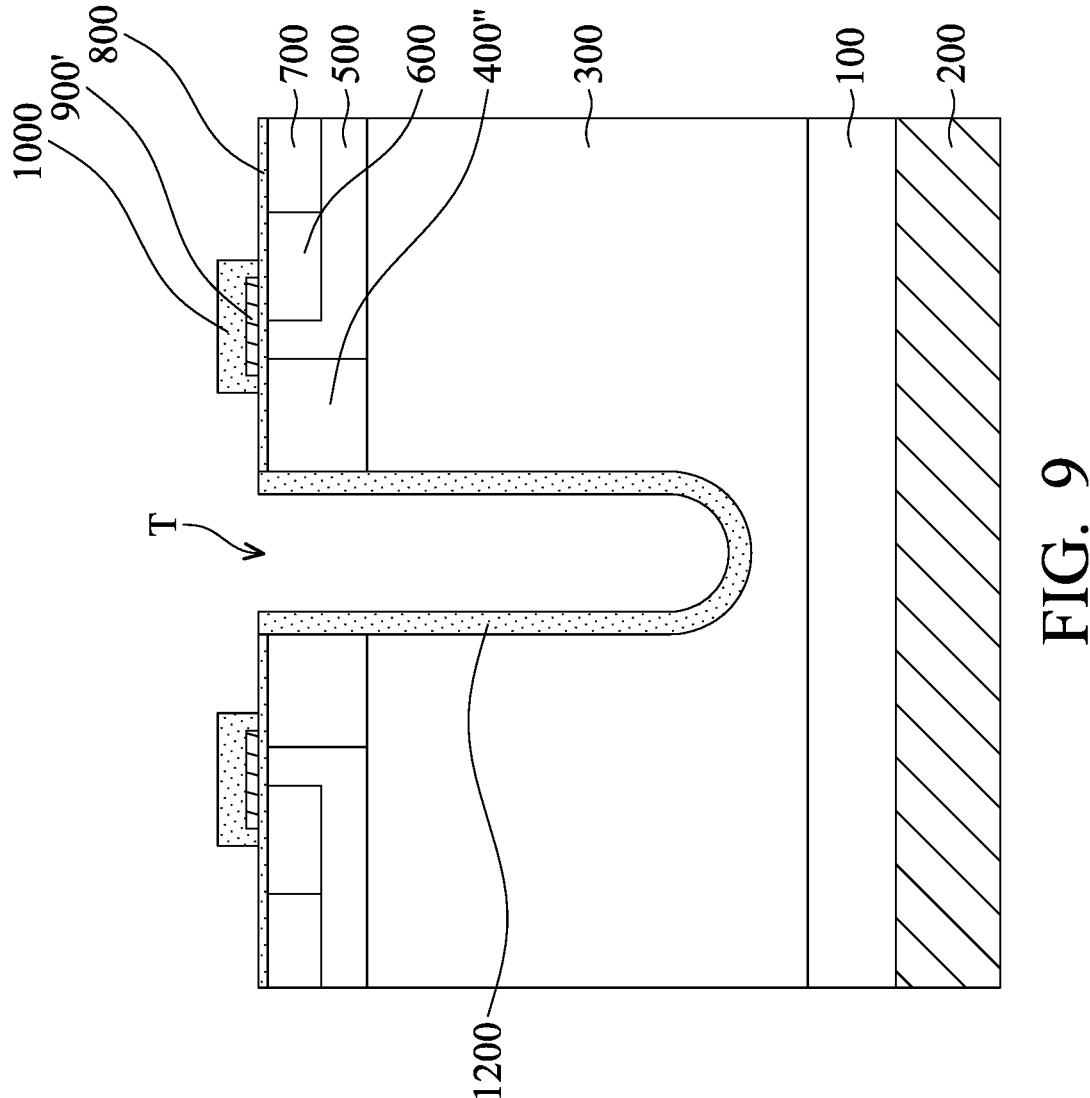

Next, referring to FIG. 9, the patterned protective layer 1100' is removed. Removal of the patterned protective layer 1100' may include an etching process with etch selectivity, such as etching patterned protective layer 1100' (nitride) without substantially etching gate dielectric layer 800, dielectric layer 1000, and shielding dielectric layer 1200 (oxide). It can be seen from FIG. 9 that at this stage, the top surfaces of the gate dielectric layer 800, the dielectric layer 1000, and the shielding dielectric layer 1200 are exposed.

Figure 10:
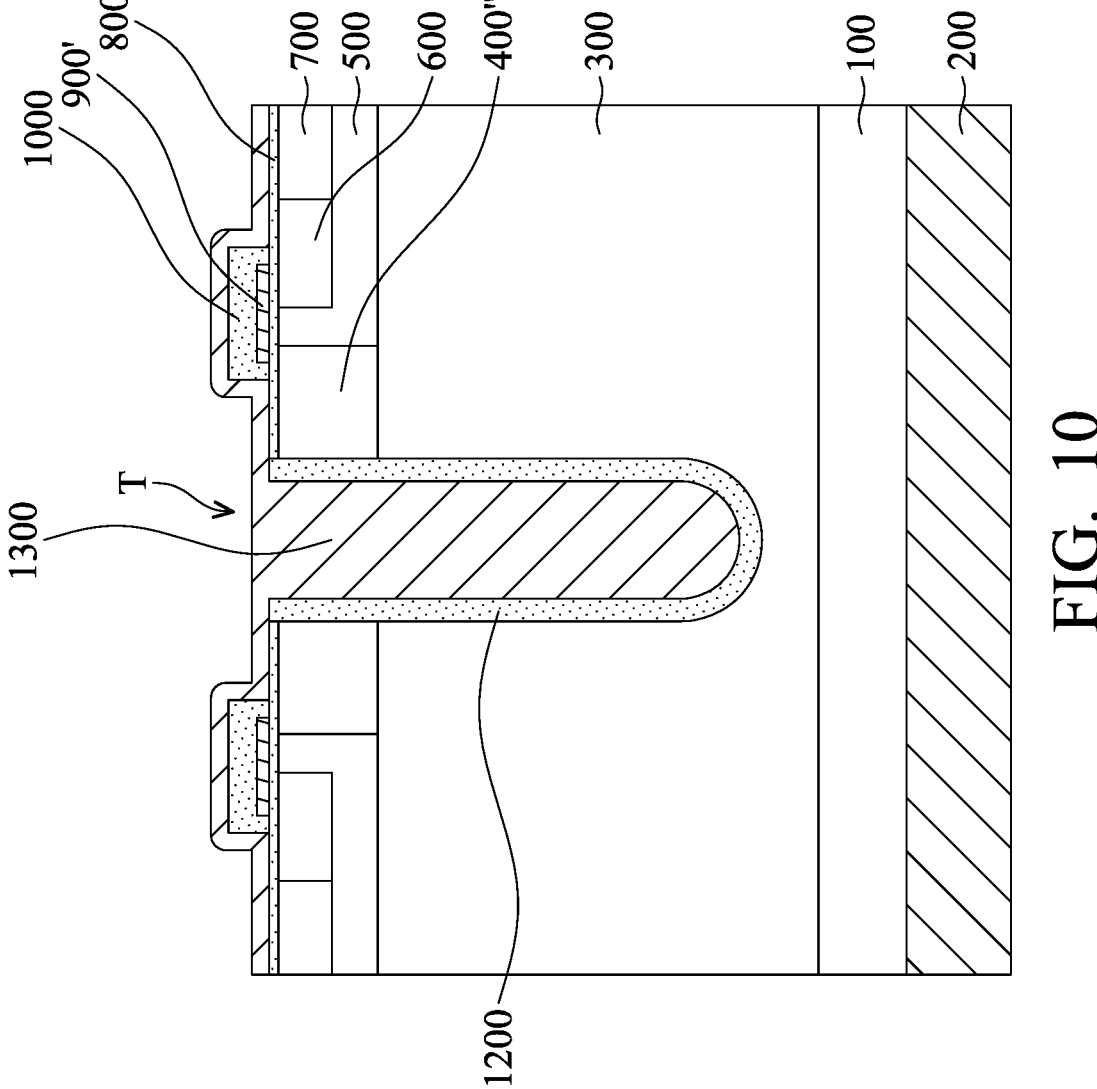

Next, referring to FIG. 10, a conductive structure material layer 1300 is conformally deposited in and on the trench T. In some embodiments, the conductive structure material layer 1300 may include conductive materials similar to those described above, and details are not described herein again. In the embodiment of the present invention, the conductive structure material layer 1300 includes polysilicon doped with the first conductive type. In some embodiments, the conductive structure material layer 1300 includes a deposition process similar to that described above, and thus is not repeated here.

Figure 11:
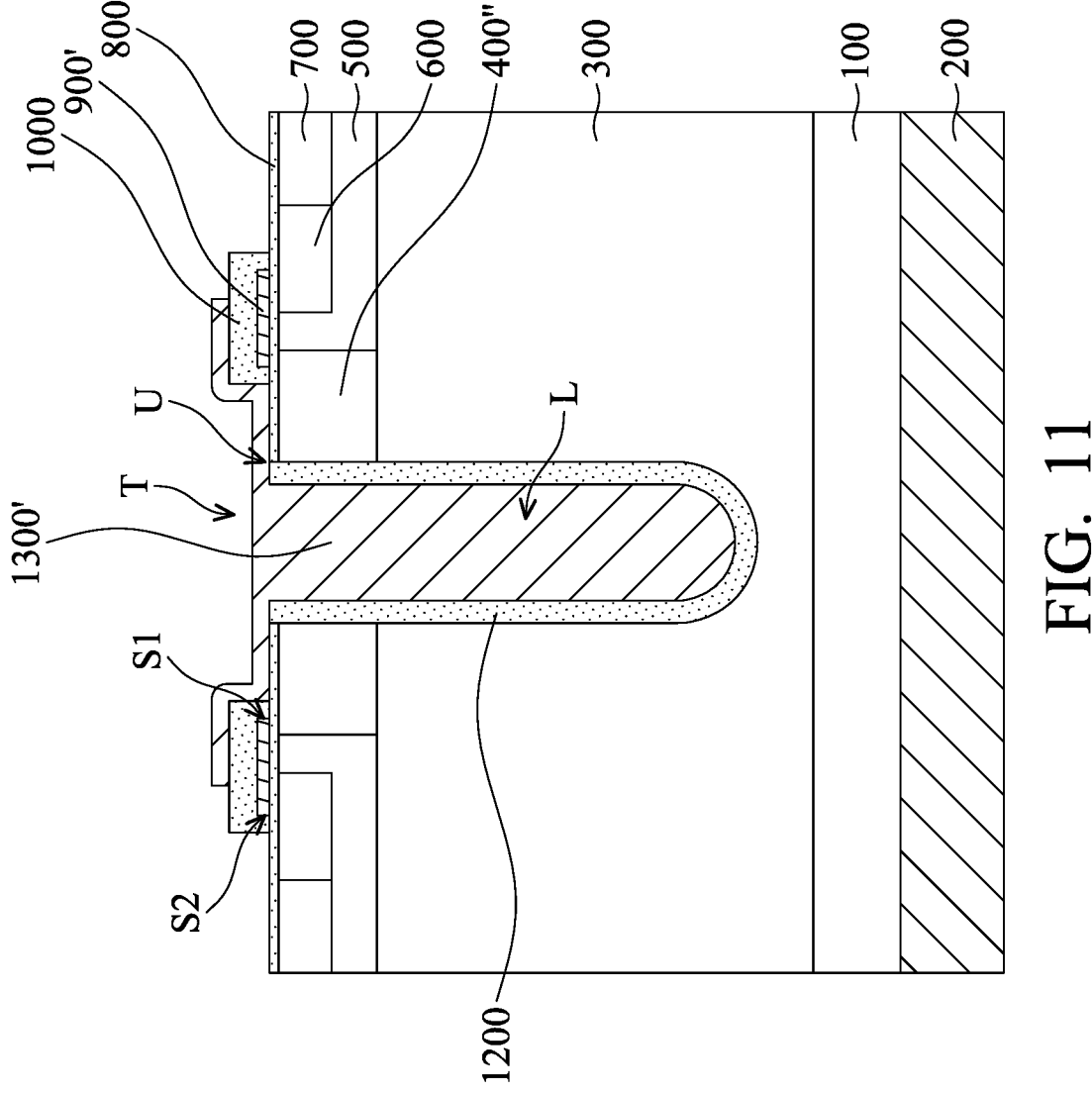

Next, referring to FIG. 11, the conductive structure material layer 1300 is patterned to form a lower portion L of the conductive structure 1300' in the trench T, and an upper portion U of the conductive structure 1300' is formed on the trench T. Here, as the gate dielectric layer 800 used as a boundary, the conductive structure 1300' on the gate dielectric layer 800 is denoted as the upper portion U; the conductive structure 1300' under the gate dielectric layer 800 is denoted as a lower portion L. The lower portion L extends into the epitaxy layer 300 in the direction of the substrate 100. That is, the lower portion L is surrounded by a portion of the epitaxy layer 300. The upper portion U may be used as a horizontal field plate to reduce the risk of high electric fields at edge of the gate electrode while the lower portion L may be used as a vertical field plate to increase the depletion area and reduce the surface electric field (RESURF).

In some embodiments, the upper portion U extends along the gate dielectric layer 800 onto the dielectric layer 1000. In some embodiments, the gate electrode 900' has a first side surface S1 close to the conductive structure 1300' and a second side surface S2 opposite to the first side surface S1.

That is, the second side surface S2 is farther from the conductive structure 1300' than the first side surface S1. The upper portion of the conductive structure 1300' extends beyond the first side surface S1 but not beyond the second side surface S2 to reduce the oxygen electric field at the edge of the gate electrode 900' and improve the reliability of the device.

In some embodiments, the current splitting layer 400" surrounds a portion of the lower portion L of the conductive structure 1300'. That is, the current splitting layer 400" is disposed between the lower portion L of the conductive structure 1300' and the pair of well regions 500. In some embodiments, a pair of well regions 500, a pair of first heavily doped regions 600, a pair of second heavily doped regions 700, and a pair of gate electrodes 900' are all symmetrical with respect to the conductive structure 1300'. That is, a pair of well regions 500 are disposed on both sides of the lower portion L of the conductive structure 1300'; a pair of first heavily doped regions 600 and a pair of second heavily doped regions 700 are arranged on both sides of the lower portion L of the conductive structure 1300; a pair of gate electrodes 900' are disposed on both sides of the upper portion U of the conductive structure 1300'.

In some embodiments, the upper portion U of the conductive structure 1300' is spaced apart from the gate electrode 900' by the dielectric layer 1000 and extends along the one side surface of the gate electrode 900' and directly above the gate electrode 900' by the dielectric layer 1000, but does not extend to the other side of the gate electrode 900'. In this way, the electric field at the edge of the gate electrode may be effectively reduced, thereby improving the reliability of the device.

In some embodiments, the conductive structure 1300' may be used as a source (S) or a gate (G) according to actual needs.

In some embodiments, the patterning of the conductive structure material layer 1300 includes a lithography process and an etching process similar to the above. For example, a patterned photoresist is formed by the lithography process, and the conductive structure material layer 1300 is etched by the patterned photoresist. It should be noted that the upper portion of the conductive structure material layer 1300 is patterned to form the upper portion U of the conductive structure 1300', while the lower portion of the conductive structure material layer 1300 is substantially unaffected by the patterning, and thus denote as the lower portion L of the conductive structure 1300'.

Next, referring to FIG. 12, an inter-layer dielectric layer 1400 is formed on the conductive structure 1300' to isolate the conductive structure 1300' from the source electrode formed subsequently. In some embodiments, the inter-layer dielectric layer 1400 includes a dielectric material similar to that described above, such as oxide, and thus is not described herein again.

In some embodiments, the formation of the inter-layer dielectric layer 1400 includes a deposition process, a lithography process, an etching process, and the like, which are similar to the foregoing. For example, a dielectric material may be deposited by a deposition process, and then patterned by a patterning process to form the inter-layer dielectric layer 1400. It should be noted that the dielectric materials included in the interlayer dielectric layer 140, the dielectric layer 1000 and the gate dielectric layer 800 are all oxides. Thus, when the interlayer dielectric layer 1400 is formed, the gate dielectric layer 800 and the dielectric layer 1000 are also patterned. Therefore, the side surfaces of the interlayer dielectric layer 1400 are substantially aligned with the side surfaces of the gate dielectric layer 800 and the side surfaces of the dielectric layer 1000.

Continuing to refer to FIG. 12, a contact metal 1500 is formed on the first heavily doped region 600 and the second heavily doped region 700 to electrically connect the subsequently formed source electrodes. In detail, the contact metal 1500 completely covers the second heavily doped region 700 and only covers a portion of the first heavily doped region 600. In some embodiments, the contact metal 1500 may include titanium (Ti), titanium nitride (TiN), nickel (Ni). In some embodiments, the formation of the contact metal 1500 includes a deposition process, a lithography process, an etching process, and the like, which are similar to the above-mentioned processes, and thus not be repeated here.

Figure 12:
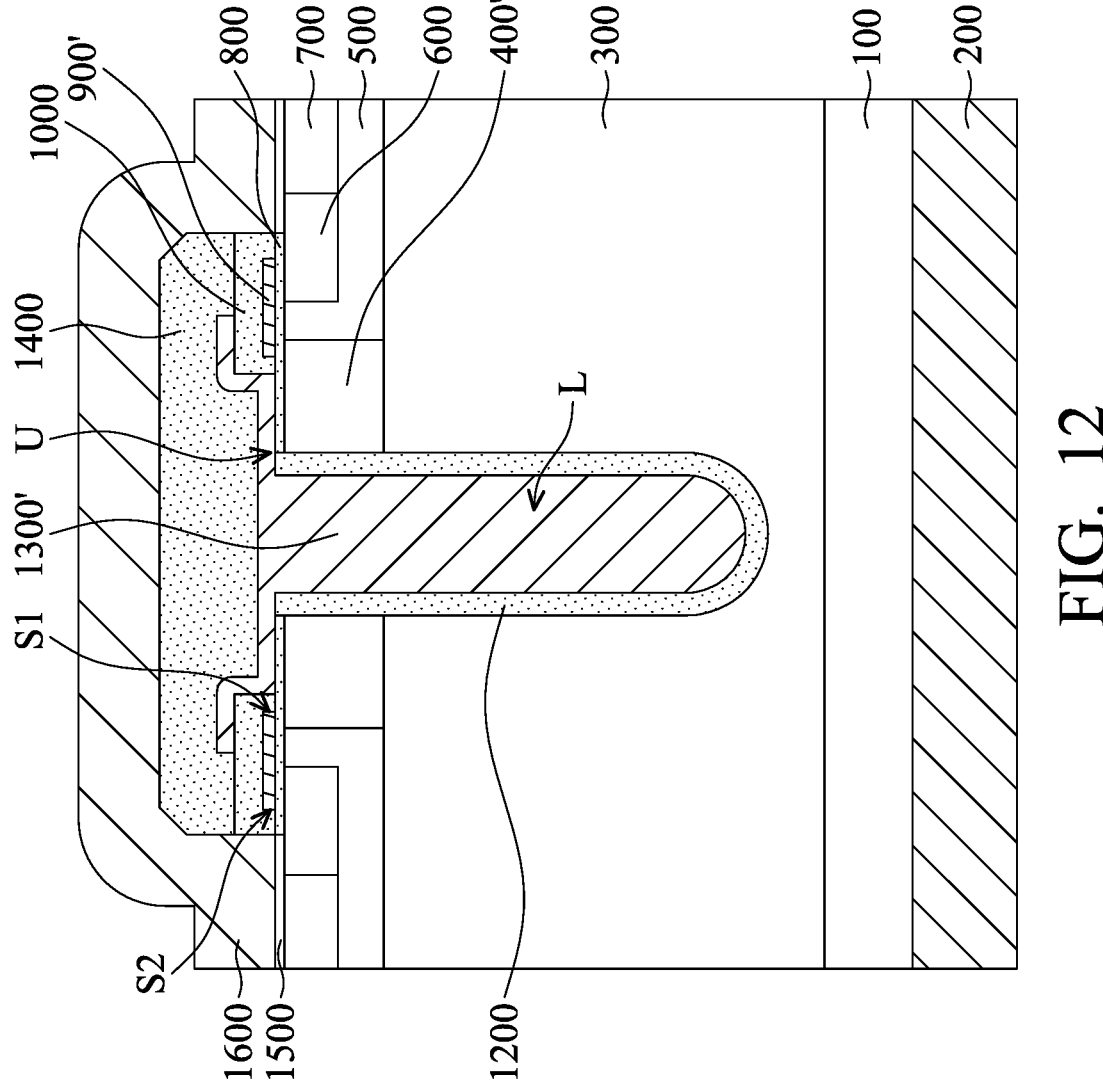

Continuing to refer to FIG. 12, a source electrode 1600 is formed on the conductive structure 1300'. In detail, the source electrode 1600 is formed on the contact metal 1500 and the inter-layer dielectric layer 1400. That is, the source electrode 1600 completely covers the top surface and side surfaces of the inter-layer dielectric layer 1400 to reduce the electric field strength at the edge of the upper portion U (field plate) of the conductive structure 1300'. In some embodiments, the source electrode 1600 may include a conductive material similar to that described above, and may be formed by a deposition process, sputtering, resistive heating evaporation, electron beam evaporation, or the like.

To sum up, by disposing the upper portion of the conductive structure in the epitaxy layer, the embodiment of the present invention may effectively increase the doping concentration of the epitaxy layer and effectively suppress the on-resistance (Rdson) while maintaining breakdown voltage. By the upper portion of the conductive structure spaced by a dielectric layer and disposed directly above the gate electrode and on the side surface of the gate electrode, the embodiment of the present invention reduces the oxygen electric field at the edge of the gate electrode, thereby improving the reliability of the device. By the two gate electrodes separated by a conductive structure, the embodiment of the present invention reduces the total length of the gate electrode, thereby effectively reducing the gate-to-drain capacitance (Cgd). By the current splitting layer, the embodiment of the present invention further reduces the on-resistance (Rdson).

The protection scope of the present disclosure is not limited to the process, machine, manufacture, material composition, device, method and step in the specific embodiments described in the specification. In the disclosure of the embodiments, it is understood that current or future processes, machines, manufactures, compositions of matter, devices, methods and steps can be implemented as long as substantially the same functions or substantially the same results can be achieved in the embodiments described herein. Use according to some embodiments of the present disclosure. Therefore, the protection scope of the present disclosure includes the aforementioned process, machine, manufacture, composition of matter, apparatus, method and steps. In addition, each claimed scope constitutes a separate embodiment, and the protection scope of the present disclosure also includes the combination of each claimed scope and the embodiments.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A semiconductor structure, comprising:
a substrate having a first conductive type;
an epitaxy layer disposed on the substrate and having the first conductive type;
a well region disposed in the epitaxy layer and having a second conductive type different than the first conductive type;
a gate electrode disposed on the well region;
a conductive structure including an upper portion and a lower portion, wherein the lower portion extends in a direction of the substrate into the epitaxy layer and the upper portion is disposed on the epitaxy layer,
wherein the gate electrode has a first side surface near the conductive structure and a second side surface opposite the first side surface, wherein a side surface of the upper portion of the conductive structure is disposed between the first side surface and the second side surface;
an inter-layer dielectric layer disposed on the conductive structure; and
a source electrode disposed on the conductive structure, wherein the source electrode is spaced apart from the conductive structure by the inter-layer dielectric layer.

2. The semiconductor structure as claimed in claim 1, further comprising a current splitting layer disposed on the epitaxy layer.

3. The semiconductor structure as claimed in claim 2, wherein the current splitting layer surrounds a portion of the lower portion of the conductive structure.

4. The semiconductor structure as claimed in claim 2, wherein a doping concentration of the current splitting layer is greater than a doping concentration of the epitaxy layer.

5. The semiconductor structure as claimed in claim 2, wherein a bottom surface of the well region is not higher than a bottom surface of the current splitting layer.

6. The semiconductor structure as claimed in claim 1, further comprising a shielding dielectric layer disposed between the conductive structure and the epitaxy layer, wherein the shielding dielectric layer has a substantially uniform thickness.

7. The semiconductor structure as claimed in claim 1, further comprising a first heavily doped region and a second heavily doped region adjacent to the first heavily doped region, wherein the first heavily doped region has the first conductive type and the second heavily doped region has the second conductive type.

8. The semiconductor structure as claimed in claim 7, wherein the well region covers a bottom surface of the first heavily doped region.

9. A semiconductor structure, comprising:
a substrate having a first conductive type;

an epitaxy layer disposed on the substrate and having the first conductive type;

a conductive structure including an upper portion and a lower portion, wherein the lower portion extends in a direction of the substrate into the epitaxy layer and the upper portion is disposed on the epitaxy layer;

a pair of well regions disposed on opposite sides of the lower portion of the conductive structure and having a second conductive type different than the first conductive type;

a pair of gate electrodes disposed on opposite sides of the upper portion of the conductive structure, wherein one of the gate electrodes has a first side surface near the conductive structure and a second side surface opposite the first side surface, wherein a side surface of the upper portion of the conductive structure is disposed between the first side surface and the second side surface;

an inter-layer dielectric layer disposed on the conductive structure; and a source electrode disposed on the pair of the gate electrodes, wherein the source electrode is spaced apart from the conductive structure by the inter-layer dielectric layer.

10. The semiconductor structure as claimed in claim 9, further comprising a current splitting layer having the first conductive type, wherein the current splitting layer is disposed between the lower portion of the conductive structure and the pair of the well regions.

11. The semiconductor structure as claimed in claim 9, wherein the opposite sides of the upper portion of the conductive structure extends directly above the pair of the gate electrodes.

12. A method for forming a semiconductor structure, comprising:

providing a substrate, wherein the substrate has a first conductive type;

forming an epitaxy layer on the substrate, wherein the epitaxy layer has the first conductive type;

forming a current splitting layer on the epitaxy layer;

forming a well region in the epitaxy layer after forming the current splitting, wherein the well region has a second conductive type different than the first conductive type;

forming a gate electrode on the well region;

forming an upper portion and a lower portion of a conductive structure on the epitaxy layer and in the epitaxy layer, respectively; and forming a source electrode on the conductive structure.

13. The method as claimed in claim 12, wherein forming the gate electrode comprises:

forming a patterned gate electrode on the current splitting layer; and oxidizing the patterned gate electrode to form the gate electrode and a dielectric layer covering the gate electrode.

14. The method as claimed in claim 12, wherein after forming the gate electrode, the method further comprises:

conformally depositing a protective layer on the gate electrode;

patterning the protective layer;

using the patterned protective layer as an etching mask, etching the epitaxy layer to form a trench;

oxidizing the trench to form a shielding dielectric layer on sidewalls and a bottom of the trench; and removing the patterned protective layer.

15. The method as claimed in claim 14, wherein forming the conductive structure comprises:

depositing a conductive structure material layer on the trench and in the trench;

patterning the conductive structure material layer to form the lower portion of the conductive structure in the trench and to form the upper portion of the conductive structure on the trench.

16. The method as claimed in claim 12, wherein after forming the well region, the method further comprises:

forming a first heavily doped region in the well region, wherein the first heavily doped region has the first conductive type; and forming a second heavily doped region adjacent to the first heavily doped region, wherein the second heavily doped region has the second conductive type.

17. The method as claimed in claim 16, wherein the gate electrode spans over the first heavily doped region but does not span over the second heavily doped region.

18. The method as claimed in claim 12, further comprising forming a gate dielectric layer on the well region after forming the well region and forming an inter-layer dielectric layer on the conductive structure after forming the conductive structure, wherein the gate dielectric layer and the inter-layer dielectric layer comprise oxide.

* * * * *